(12) United States Patent
Lee et al.

(10) Patent No.: US 11,067,242 B2
(45) Date of Patent: Jul. 20, 2021

(54) PHOSPHOR MODULE

(71) Applicant: LG Electronics Inc., Seoul (KR)

(72) Inventors: Jongmoo Lee, Seoul (KR); Eunyoung Kim, Seoul (KR); Mongkwon Jung, Seoul (KR); Byungwoo Jeoung, Seoul (KR)

(73) Assignee: LG Electronics Inc., Seoul (KR)

(*) Notice: Subject to any disclaimer, the term of this patent is extended or adjusted under 35 U.S.C. 154(b) by 359 days.

(21) Appl. No.: 15/885,121

(22) Filed: Jan. 31, 2018

(65) Prior Publication Data
US 2019/0137061 A1   May 9, 2019

(30) Foreign Application Priority Data
Nov. 3, 2017 (KR) .................. 10-2017-0146198

(51) Int. Cl.
| | |
|---|---|
| F21S 41/176 | (2018.01) |
| F21S 41/16 | (2018.01) |
| F21S 45/47 | (2018.01) |
| F21V 9/32 | (2018.01) |
| F21V 7/26 | (2018.01) |

(Continued)

(52) U.S. Cl.
CPC ............. *F21S 41/16* (2018.01); *F21K 9/64* (2016.08); *F21S 41/141* (2018.01); *F21S 41/176* (2018.01); *F21S 41/192* (2018.01); *F21S 45/47* (2018.01); *F21V 7/26* (2018.02); *F21V 9/32* (2018.02); *F21V 29/83* (2015.01); *G02B 6/0023* (2013.01); *G02B 6/0043* (2013.01);

(Continued)

(58) Field of Classification Search
CPC .......... F21S 41/176; F21K 9/64; F21V 29/70
See application file for complete search history.

(56) References Cited

U.S. PATENT DOCUMENTS

| | | | |
|---|---|---|---|
| 9,634,216 B2* | 4/2017 | Inomata | ............... H01L 33/644 |
| 2013/0250544 A1 | 9/2013 | Zink et al. | |

(Continued)

FOREIGN PATENT DOCUMENTS

| | | |
|---|---|---|
| CN | 102272517 | 12/2011 |
| CN | 104968995 | 10/2015 |

(Continued)

OTHER PUBLICATIONS

Extended European Search Report in European Application No. 18197670.5, dated Mar. 19, 2019, 7 pages.

(Continued)

*Primary Examiner* — Andrew J Coughlin
(74) *Attorney, Agent, or Firm* — Fish & Richardson P.C.

(57) ABSTRACT

A phosphor module for a laser light source includes a heat radiator, a phosphor layer disposed at the heat radiator and configured to absorb and emit light, where a wavelength of the emitted light is different from a wavelength of the absorbed light, a reflective layer that covers a side surface of the phosphor layer and is configured to reflect light, and an adhesive layer disposed between the phosphor layer and the heat radiator and between the reflective layer and the heat radiator, the adhesive layer being configured to couple each of the phosphor layer and the reflective layer to the heat radiator. A thermal conductivity of the adhesive layer is greater than a thermal conductivity of each of the phosphor layer and the reflective layer.

20 Claims, 6 Drawing Sheets

(51) Int. Cl.
*F21V 29/83* (2015.01)
*F21K 9/64* (2016.01)
*F21S 41/19* (2018.01)
*F21S 41/141* (2018.01)
*F21V 8/00* (2006.01)
*H01L 33/50* (2010.01)

(52) U.S. Cl.
CPC ......... *G02B 6/0055* (2013.01); *G02B 6/0068* (2013.01); *H01L 33/504* (2013.01)

(56) References Cited

U.S. PATENT DOCUMENTS

| | | | |
|---|---|---|---|
| 2015/0184830 A1* | 7/2015 | Nagao | F21S 45/47 362/583 |
| 2016/0040857 A1 | 2/2016 | Inoue et al. | |
| 2016/0245494 A1 | 8/2016 | Weber et al. | |
| 2018/0172894 A1* | 6/2018 | Sohn | G02B 6/0055 |
| 2019/0081452 A1* | 3/2019 | Miura | H01S 5/02288 |
| 2019/0219248 A1* | 7/2019 | Patent | F21S 41/176 |

FOREIGN PATENT DOCUMENTS

| | | |
|---|---|---|
| EP | 3236136 | 10/2017 |
| JP | 2012089316 | 5/2012 |
| JP | 2012226986 | 11/2012 |
| JP | 2014160555 | 9/2014 |
| JP | 2015060789 | 3/2015 |
| JP | 2015195098 | 11/2015 |
| KR | 1020160069621 | 6/2016 |
| WO | WO2012108384 | 8/2012 |
| WO | WO2017115778 | 7/2017 |

OTHER PUBLICATIONS

Chinese Office Action in Chinese Application No. 201810211685.2, dated Sep. 3, 2020, 20 pages (with English translation).

* cited by examiner

PHOSPHOR MODULE

CROSS-REFERENCE TO RELATED APPLICATION

Pursuant to 35 U.S.C. § 119(a), this application claims the benefit of earlier filing date and right of priority to Korean Application No. 10-2017-0146198, filed on Nov. 3, 2017, the contents of which is incorporated by reference herein in its entirety.

FIELD

The present disclosure relates to a phosphor module for a laser light source.

BACKGROUND

Referring to FIG. 1, an example vehicle 1 includes a lamp unit 100 for providing a driver with visibility or for informing other vehicles of the driving state of the vehicle 1, for example, when the outside is dark.

A vehicular lamp unit may include a head lamp installed at the front of the vehicle and a rear lamp installed at the rear of the vehicle. The head lamp is a lamp that may illuminate the front of the vehicle to lighten the front during a night operation. The rear lamp includes a brake light that may be turned on when the driver operates a brake and a turn signal light that indicates a traveling direction of the vehicle.

Referring to FIG. 2, there is a growing interest in the vehicular lamp unit 100 that uses an energy-efficient laser light source 10. For example, light emitted from a laser diode is straight, an irradiation distance may be long, and may not interfere with a field of view of an oncoming vehicle.

A white light may be implemented by using the laser diode(s).

For example, light emitted from three types of laser diodes may be mixed to implement white light. In this case, each of the three laser diodes may emit light of three primary colors.

In another example, light emitted from a blue laser diode may be converted into yellow light, and then mixed with light emitted from the blue laser diode to implement white light. In this example, the white light may be be implemented using one type of laser.

In some examples, a phosphor may optically convert blue light emitted from the laser diode. The laser diode may emit light with very high output power, and when light emitted from the laser diode is optically converted, a temperature of the phosphor may rise to 150° C. or more.

In the case of a resin phosphor and a phosphor-in-glass (PIG, hereinafter referred to as "glass phosphor") which have been conventionally used for an LED light source, thermal quenching may occur during an optical conversion process of laser light.

In some examples, yellow light optically converted from the phosphor may be scattered and widely spread, and accordingly, part of the yellow light that is optically converted in the phosphor is emitted to the outside without being mixed with the blue light. In some cases, a yellow ring may be generated in which yellow light is emitted to the periphery of a light emitting region of the laser light source occurs.

SUMMARY

One object of the present disclosure may be to provide a structure for minimizing a yellow ring generated from a phosphor module.

Another object of the present disclosure may be to provide a structure for effectively releasing heat generated during optical conversion in a phosphor module to the outside.

Another object of the present disclosure may be to provide a structure for increasing the luminance of a light source.

According to one aspect of the subject matter described in this application, a phosphor module for a laser light source includes a heat radiator, a phosphor layer disposed at the heat radiator and configured to absorb and emit light, where a wavelength of the emitted light is different from a wavelength of the absorbed light, a reflective layer that covers a side surface of the phosphor layer and is configured to reflect light, and an adhesive layer disposed between the phosphor layer and the heat radiator and between the reflective layer and the heat radiator, the adhesive layer being configured to couple each of the phosphor layer and the reflective layer to the heat radiator. A thermal conductivity of the adhesive layer is greater than a thermal conductivity of each of the phosphor layer and the reflective layer.

Implementations according to this aspect includes one or more of the following features. For example, the reflective layer may include a first reflective layer having a first side that contacts the side surface of the phosphor layer, and a second reflective layer that contacts a second side of the first reflective layer that does not contact the side surface of the phosphor layer. A reflectance of the first reflective layer may be greater than a reflectance of the second reflective layer. A thermal conductivity of the second reflective layer may be greater than a thermal conductivity of the first reflective layer. For example, the reflective layer may include a mixture of titanium oxide and at least one of alumina (Al2O3), spinel (MgAl2O4), or aluminum oxynitride (AlON).

In some implementations, the heat radiator may define a recess having a plurality of side surfaces and a bottom surface, and the phosphor layer and the reflective layer may be disposed on the bottom surface of the recess. In some examples, the adhesive layer may include a first region disposed between the bottom surface of the recess and the phosphor layer, and a second region that extends from the first region along a side surface of the reflective layer, where the second region of the adhesive layer may be configured to couple the side surface of the reflective layer to a side surface of the recess among the plurality of side surfaces. In some cases, the bottom surface of the recess may include a plurality of protrusions and a plurality of recesses. The plurality of protrusions may be interposed between the plurality of recesses, respectively.

In some examples, the phosphor module may further include a reflective film disposed between the adhesive layer and the phosphor layer and configured to reflect light. The reflective layer and the reflective film may be made of different materials. In some examples, the reflection film may include a first layer that contacts the adhesive layer, where the first layer includes a metal material or an alloy, and a second layer disposed on the first layer and configured to couple the first layer of the reflection film to the phosphor layer. A thickness of the phosphor layer and a thickness of the reflective layer may be, respectively, less than or equal to a depth of the recess. In some examples, the adhesive layer may include a Sn—Ag—Cu-based soldering material, a Sn—Au-based soldering material, a Sn—Bi-based soldering material, or an Ag-containing resin material. The reflective layer may include a ceramic material and be configured to transmit heat generated from the phosphor layer to the reflective layer.

In some implementations, a top surface of the phosphor layer may include a plurality of protrusions and a plurality of recesses. The plurality of protrusions may be interposed between the plurality of recesses, respectively. The heat radiator may define a recess configured to receive the phosphor layer and the reflective layer within the recess, and a top surface of the phosphor layer and a top surface of the reflective layer are coplanar with a top surface of the heat radiator.

In some examples, the wavelength of the emitted light from the phosphor layer may be longer than the wavelength of the absorbed light. The phosphor layer may include at least one of YAG:Ce, LuAG:Ce, Sr2SiO4:Eu, or a nitride-based yellow phosphor.

According to the present disclosure, yellow light traveling to a side surface of the phosphor layer may be reflected and directed toward a front surface of the phosphor layer, thereby minimizing an area of a yellow ring.

In addition, heat generated during an optical conversion in a phosphor layer may be efficiently emitted to the outside, and light reflected from the side surface of the phosphor layer may be directed to the front surface of the phosphor layer, thereby increasing the brightness of the light source.

DETAILED DESCRIPTION

Figure 1:
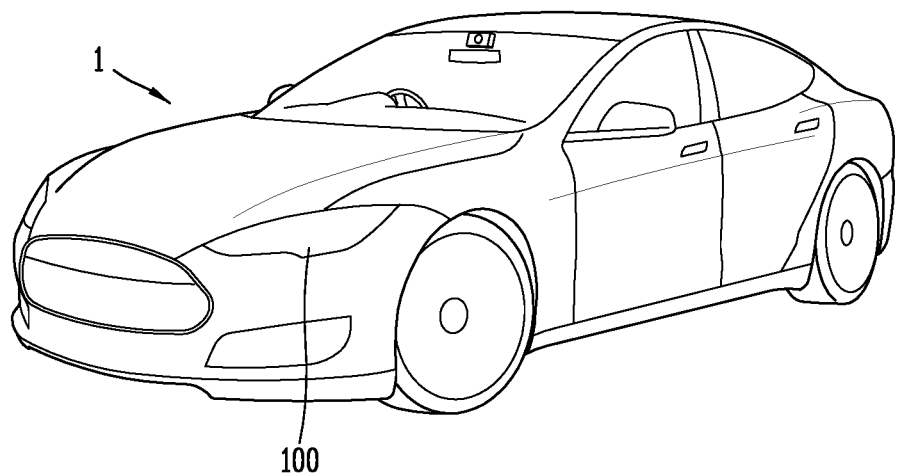
FIG. 1 is a conceptual view illustrating an example vehicle.
Figure 2:
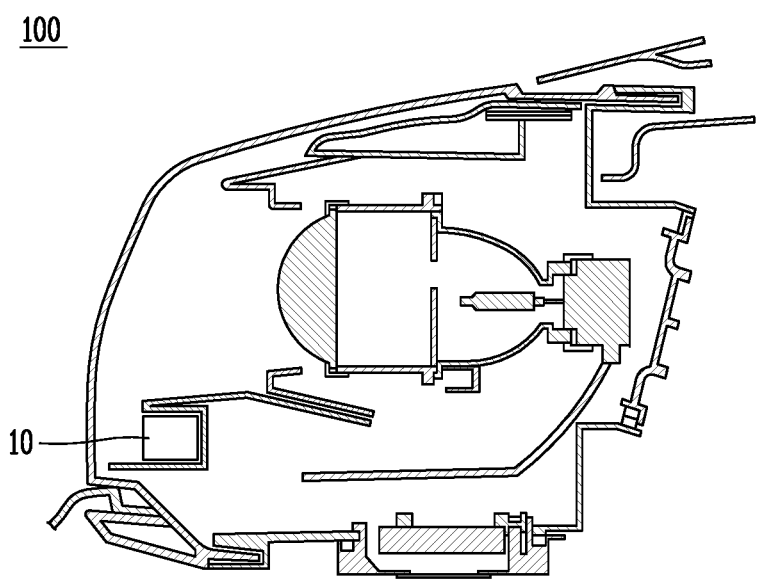
FIG. 2 is a cross-sectional view illustrating an example lamp unit included in the vehicle.

The implementations disclosed herein will be described in detail with reference to the accompanying drawings, and the same or similar elements are designated with the same numeral references regardless of the numerals in the drawings and their redundant description will be omitted.

Prior to describing a phosphor module, a laser light source using the phosphor module will be described.

Figure 3:
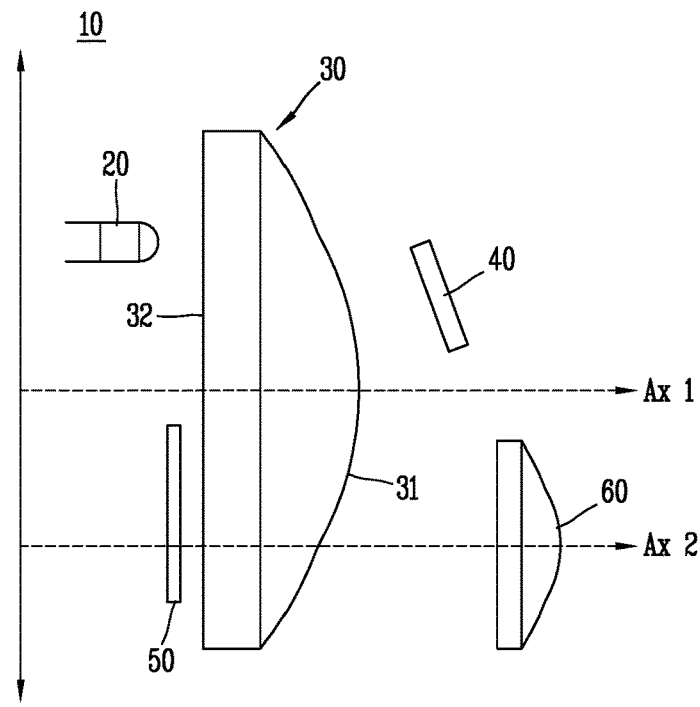
FIG. 3 is a conceptual view illustrating an example reflective laser light source.
Figure 4:
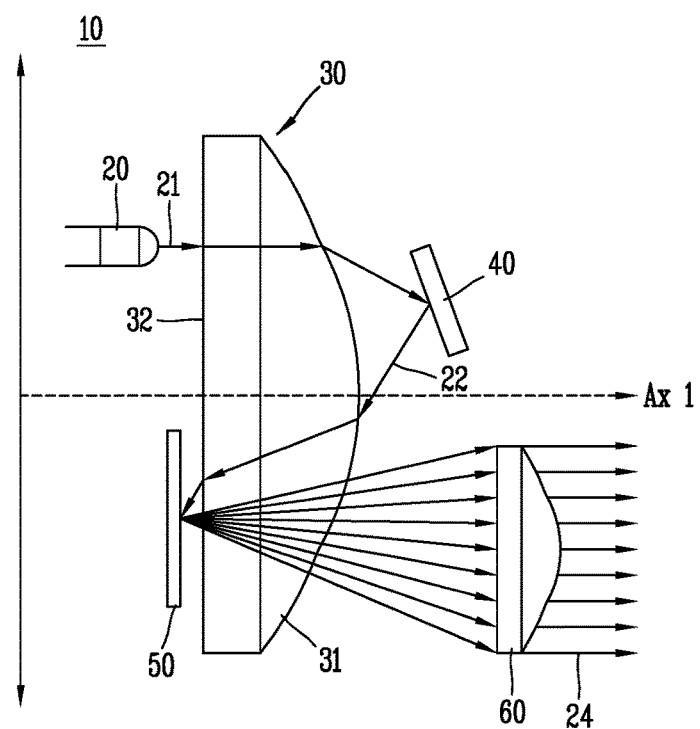
FIG. 4 is a conceptual view illustrating an example traveling path of light in the reflective laser light source illustrated in FIG. 3.

FIG. 3 is a conceptual view illustrating an example reflective laser light source, and FIG. 4 is a conceptual view illustrating an example traveling path of light in the reflective laser light source illustrated in FIG. 3.

The laser light source 10 may be implemented through the structure of FIG. 3. Referring to FIG. 3, the laser light source 10 may include a blue laser diode 20, a condenser lens 30, a reflector 40, a phosphor module 50, and an auxiliary condenser lens 60.

For example, referring to FIG. 4, blue light 21 emitted from the blue laser diode 20 passes through the condenser lens 30 and is reflected by the reflector 40. The blue light 22 reflected by the reflector 40 passes again through the condenser lens 30 and is incident on the phosphor module 50.

Part of the blue light incident on the phosphor module 50 is converted into yellow light. In some examples, since the phosphor module 50 includes a reflective layer, it reflects part of the blue light incident on the phosphor module 50. Accordingly, yellow light and the blue light reflected by the phosphor module 50 are combined to become white light. The white light is condensed by the auxiliary condenser lens 60 and then emitted to the outside 24.

The laser light source having the structure described in FIGS. 3 and 4 is referred to as a "reflective laser light source." As described above, the reflective laser light source includes the phosphor module 50.

The phosphor module 50 includes a phosphor layer for converting blue light into yellow light, but due to the characteristics of a laser diode with high power output, when a resin phosphor or a glass phosphor, which has been used for an LED light source in the related art or the like, is used for optical conversion of a laser diode, there is a problem that thermal quenching occurs in the phosphor.

In some examples, ceramic phosphors have been used to solve a problem that occurs when laser light is optically converted using a resin phosphor or a glass phosphor. However, in the case of a ceramic phosphor, since the sintering temperature is as high as 1500° C. or more, it is difficult to control a particle size and pore of the ceramic phosphor.

When the particle size and pore of the phosphor layer cannot be controlled, a scattering degree in the phosphor layer may be increased. When a scattering factor thereof increases in the case of being included in the phosphor layer, there is a problem in that a phenomenon (hereinafter referred to as a "yellow ring") in which yellow light is emitted to the periphery of a light emitting region of the laser light source occurs.

The present disclosure provides a structure of a phosphor module capable of minimizing a yellow ring even when a ceramic phosphor whose scattering degree is difficult to control is used.

For example, the present disclosure may minimize an area of a phosphor layer included in the phosphor module. When the area of the phosphor layer is reduced, an area of the yellow ring also decreases, but some problems may arise.

First, when the area of the phosphor layer is reduced, an optical conversion efficiency of the phosphor layer is reduced. Accordingly, when laser light is irradiated to the phosphor module, the brightness of light emitted from the phosphor module is reduced. Therefore, in a phosphor module in the related art, an area of the phosphor layer cannot be reduced to a predetermined level or less.

Second, when the area of the phosphor layer is reduced, a contact area between the phosphor layer and the heat radiator may be reduced, thereby resulting in a poor heat dissipation efficiency, and causing thermal quenching in the phosphor layer.

The present disclosure may solve the above-mentioned problems, thereby reducing the area of the phosphor layer to a predetermined level or less. Through this, the present disclosure minimizes an area of the yellow ring. Hereinafter, the structure of the phosphor module will be described in detail.

The phosphor module does not emit light by itself, but emits light through optical conversion when irradiated with laser light. In the present specification, the expression "brightness of the phosphor module" denotes the brightness of light output from the phosphor module when laser light is irradiated to the phosphor module. In some examples, the expression "brightness of the phosphor module" may vary depending on an amount of laser light irradiated to the phosphor module, but the expression "increase/decrease in brightness of the phosphor module" indicates a result in which the amounts of light of the output light are compared when the same amount of light is irradiated to the phosphor module.

An upward direction of the phosphor module 200 is defined as a direction in which a reflective surface for reflecting the light traveling to the phosphor module faces. Hereinafter, an upper or lower surface of the constituent elements constituting the phosphor module is defined according to these reference. For example, light directed toward a lower side of the phosphor module is light that is not output to the outside, whereas light directed toward an upper side of the phosphor module is light output to the outside. An amount of light of the phosphor module is determined by an amount of light directed toward the upper side of the phosphor module.

Figure 5:
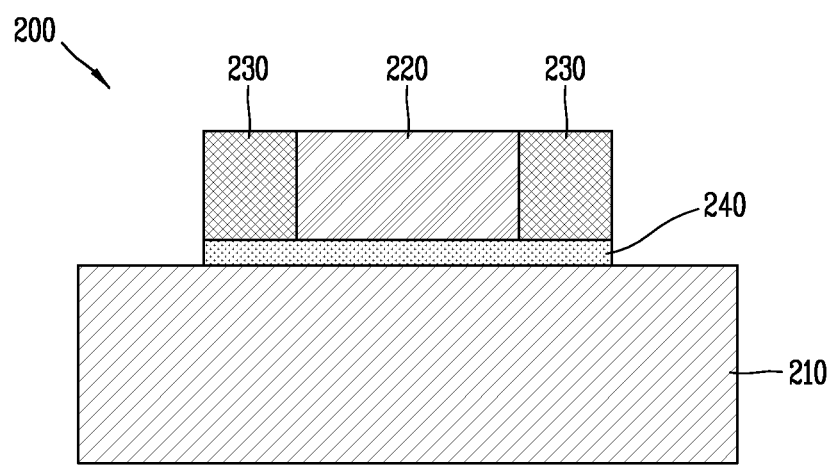
FIG. 5 is a cross-sectional view illustrating an example phosphor module.

FIG. 5 is a cross-sectional view illustrating a phosphor module.

The phosphor module 200 may include a heat radiator 210, a phosphor layer 220, a reflective layer 230, and an adhesive layer 240. Hereinafter, the above-described components will be described in detail.

The heat radiator 210 is disposed below the phosphor layer 220 to improve the heat radiation performance of the phosphor module 50. The heat radiator 210 quickly releases heat generated during optical conversion in the phosphor layer 220 to prevent the phosphor layer 220 from being thermally quenched. As an contact area between the phosphor layer 220 and the heat radiator 210 becomes larger, a heat dissipation efficiency of the heat radiator 210 may be increased.

The heat radiator 210 may reflect blue light that has passed through the phosphor layer 220 and yellow light emitted from the phosphor layer 220. A reflecting function of the heat radiator 210 may be an additional function in addition to an essential function. In some examples where a reflective material is disposed between the heat radiator 210 and the phosphor layer 220, the heat radiator 210 may not need to perform the reflecting function.

The heat radiator 210 may be made of a metal or an alloy having a high thermal conductivity. For example, the heat radiator 210 may be made of an Al alloy (ADC12, AC4C).

The phosphor layer 220 is disposed on an upper side of the heat radiator 210. The phosphor layer 220 absorbs the irradiated laser light and emits light of a wavelength different from that of the absorbed laser light.

For example, the phosphor layer 220 absorbs blue light emitted from the laser diode to emit yellow light. In this case, the phosphor layer 220 may include a yellow phosphor. For example, the phosphor layer 220 may include at least one of YAG:Ce, LuAG:Ce, $Sr_2SiO_4$:Eu, or a nitride-based yellow phosphor.

In some examples, the phosphor layer 220 may be formed of a mixture of a phosphor and a base material. For example, phosphors may be sintered and molded in a predetermined shape for use, and the base material is a material used for ensuring sinterability for phosphor sintering. The type of the phosphor layer may vary according to the type of the base material. For example, when the base material is a glass frit, the phosphor layer may be a glass phosphor, and when the base material is a ceramic, the phosphor layer may be a ceramic phosphor.

Depending on the type of the base material, the physical and optical properties of the phosphor layer 220 may vary. For example, the physical properties, which can vary according to the type of the base material, may include the heat radiation performance of the phosphor layer 220. Compared to the ceramic phosphor, the heat radiation performance of the glass phosphor is low. When the glass phosphor is used for the optical conversion of laser light with high output power, the glass phosphor may not rapidly release heat energy generated during the optical conversion process to the outside, and thus the phosphor contained in the glass phosphor is deteriorated. In some cases, when laser light is optically converted, the temperature of the phosphor layer 220 may be raised to 150° C. or higher, and the phosphor may deteriorate at the temperature.

In some examples, the physical properties, which can be changed depending on the type of the base material, may be a degree of scattering in the phosphor layer. Boundaries, pores, and bonds between particles made of base materials may contribute as scattering factors that scatter light that is optically converted from the phosphor. When the scattering factors are increased in the phosphor layer, since the optically converted yellow light spreads widely around the phosphor module, the yellow light may be emitted to the outside without being combined with blue light. As a result, a yellow ring may be formed around the laser light source.

An area of the yellow ring may decrease as an area of the phosphor layer 220 becomes smaller. In some examples, a ceramic phosphor may be used to reduce the area of the phosphor layer 220 to minimize the yellow ring.

In some cases, when the area of the phosphor layer 220 is reduced, the above-described two problems may arise. The present disclosure includes the reflective layer 230 disposed on a side surface of the phosphor layer 220.

For example, as illustrated in FIG. 5, the reflective layer 230 is formed so as to surround the side surface of the phosphor layer 220. The role of the reflective layer 230 may include the following.

In some examples, the reflective layer 230 may perform the role of reflect light directed toward the side surface of the phosphor layer 220. The reflective layer 230 reflects light traveling toward the side surface of the phosphor layer 220 to allow the light to travel to an upper side of the phosphor layer 220. Through this, the reflective layer 230 increases a ratio of an amount of light directed upward of the phosphor layer 220 to a total amount of yellow light output from the phosphor layer 220. Accordingly, the brightness of the phosphor module may be increased.

In addition, yellow light traveling toward the side surface of the phosphor layer 220 may spread widely around the phosphor module, and the reflective layer 230 reduces an amount of yellow light spreading widely around the phosphor module, thereby reducing an area of the yellow ring.

As described above, the reflective layer 230 may reflect yellow light traveling to the side surface of the phosphor layer 220, thereby increasing the brightness of the phosphor module and reducing the area of the yellow ring.

In some examples, the reflective layer 230 may perform a heat dissipation function for the phosphor layer 220. When the area of the phosphor layer 220 is reduced, a contact area between the phosphor layer 220 and the heat radiator 210 may be reduced, thereby reducing the heat dissipation efficiency. In order to compensate for this, the reflective layer 230 emits heat generated in the phosphor layer 220 to the side surface of the phosphor layer 220.

In order for the reflective layer 230 to perform the above-described two functions, the reflective layer 230 may be made of a material having a high reflectance and a high thermal conductivity. For example, the reflective layer may be made of at least one of $TiO_2$, $Ti_2O_3$, or $Al_2O_3$.

In some examples, the reflective layer 230 may be formed by etching part of the prefabricated phosphor layer, filling a material of the reflective layer 230 at the etched position, and then calcining the material. In some cases, an additional adhesive material may be not disposed between the phosphor layer 220 and the reflective layer 230. In other examples, since the phosphor layer 220 and the heat radiator 210 are separately fabricated and assembled, an additional adhesive material may be disposed between the phosphor layer 220 and the heat radiator 210.

For example, the adhesive layer 240 may bond the phosphor layer 220 and the reflective layer 230 to the heat radiator 210. The adhesive layer 240 may be disposed between each of the phosphor layer 220 and the reflective layer 230 and the heat radiator 210.

The adhesive layer 240 may be made of a material having a high thermal conductivity because the heat of the phosphor layer 220 and the reflective layer 230 is transferred to the heat radiator 210. For example, a thermal conductivity of the adhesive layer 240 should be higher than that of the phosphor layer 220 and the reflective layer 230. Through this, the adhesive layer 240 may rapidly transfer the heat of the phosphor layer 220 and the reflective layer 230 to the heat radiator 210.

In some examples, when a reflectance of the heat radiator 210 is lower than a predetermined level, the adhesive layer 240 may be made of a material having a high reflectance. For example, the adhesive layer 55 may be made of a white bonding material containing at least one of $Al_2O_3$, $SiO_2$, $ZrO_2$ or ZnO having a reflectance of 90% or more in the visible light region, or may be made of a metal bonding material containing more than 90 wt. % of silver. Here, the adhesive layer 240 may serve as a reflective layer.

In other examples, when a reflectance of the heat radiator 210 is higher than a predetermined level, the adhesive layer 240 may be made of a material having a high light transmittance. For example, the adhesive layer 240 may include at least one of poly-methyl methacrylate (PMMA), polyurethane (PU), poly-carbonate (PC), or siloxane-based bonding materials.

As described above, the area of the phosphor layer used in the phosphor module may be reduced to a predetermined level or less. Through this, the present disclosure minimizes an area of the yellow ring.

In some examples, the present disclosure provides various modified implementations for solving the problems that arise when the area of the phosphor layer is reduced. Hereinafter, the modified implementations of the present disclosure will be described with reference to the accompanying drawings.

The present disclosure provides a structure for simultaneously increasing the thermal conductivity and reflectance of the reflective layer.

Figure 6:
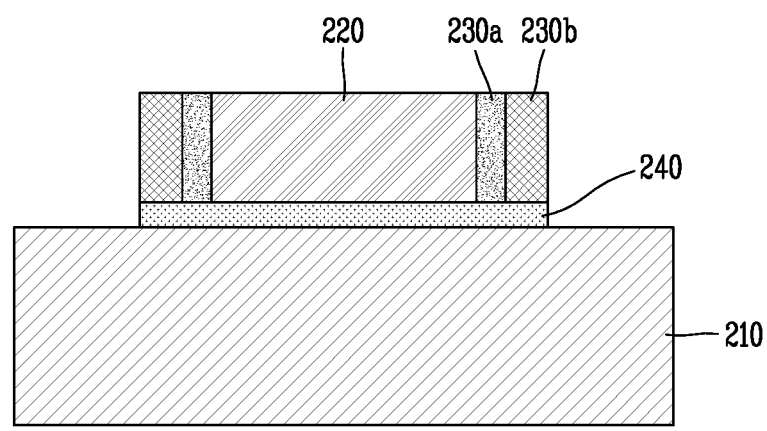
FIG. 6 is a cross-sectional view illustrating an example phosphor module including an example reflective layer composed of a plurality of layers.

FIG. 6 is a cross-sectional view illustrating a phosphor module including a reflective layer composed of a plurality of layers.

The reflective layer 230 may be capable of rapidly releasing heat generated from the phosphor layer 220 to the outside while at the same time reflecting light directed toward a side surface of the phosphor layer 220 to an upper side of the phosphor layer 220.

In some examples, the reflective layer 230 may be formed of a plurality of layers. For example, referring to FIG. 6, the reflective layer 230 may include a first reflective layer 230a in contact with a side surface of the phosphor layer 220 and a second reflective layer 230b surrounding the first reflective layer 230a.

In some examples, a reflectivity of a material forming the first reflective layer 230a may be higher than that of a material forming the second reflective layer 230b. In some examples, a thermal conductivity of the material forming the second reflective layer 230b may be higher than that of the material forming the first reflective layer 230a.

Through the above-described first and second reflective layers, the present disclosure may increase the reflectance of the reflective layer while at the same time increasing the thermal conductivity of the entire reflective layer. In some examples, the thicknesses of the first and second reflective layers may be different from each other. For example, a width of the first reflective layer 230a may be smaller than that of the second reflective layer 230b. The first reflective layer 230a may be formed only to a thickness sufficient to allow the reflective layer 230 to perform a reflective function and the second reflective layer 230b performing a heat dissipation function may be formed to have a greater width, thereby maximizing the reflectance and heat dissipation efficiency of the reflective layer 230.

In some implementations, the reflective layer 230 may not be formed with a plurality of layers. For example, the reflection layer 230 may be a mixture of a material having a high reflectivity and a material having a high thermal conductivity. In some examples, the reflective layer 230 may include a mixture of Ti oxide and at least one of alumina ($Al_2O_3$), spinel ($MgAl_2O_4$), or aluminum oxynitride (AlON). When a reflective layer is formed by mixing an aluminum oxide material having a high thermal conductivity and a Ti oxide having a high reflectivity, the reflectance and thermal conductivity of the reflective layer may be increased together.

In some examples, the present disclosure may increase the thermal conductivity of the reflective layer using the above-described heat radiator.

Figure 7A:
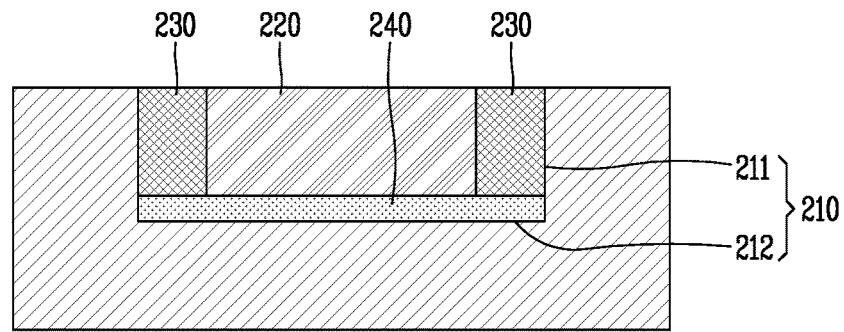
FIGS. 7A and 7B are cross-sectional views illustrating an example phosphor module including an example heat radiator having a hole.
Figure 7B:
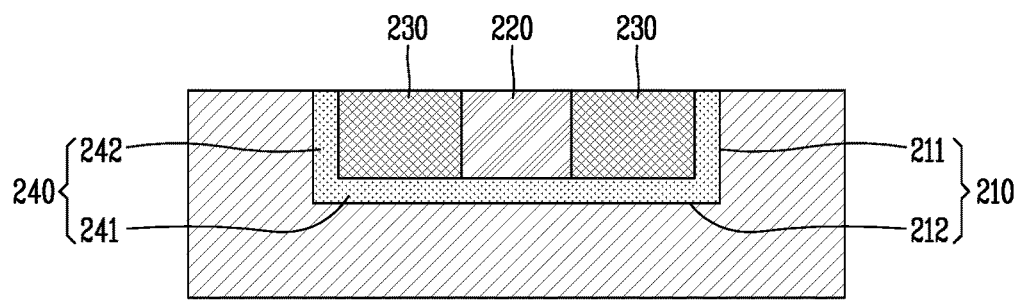

FIGS. 7A and 7B are cross-sectional views illustrating a phosphor module including a heat radiator having a hole.

A hole may be formed in the heat radiator included in the phosphor module. Referring to FIG. 7A, the heat radiator may have a hole having a plurality of side surfaces 211 and a bottom surface 212.

At this time, the phosphor layer 220 and the reflective layer 230 may be disposed on the bottom surface 212. Here, a thickness of the phosphor layer 220 and the reflective layer 230 may be equal to or less than a depth of the hole. In this case, the phosphor layer 220 and the reflective layer 230 are disposed inside the hole.

In some examples, in order to fix the phosphor layer 220 and the reflective layer 230 to the hole, an adhesive layer 240 may be formed on the bottom surface 212 of the hole. The adhesive layer 240 transfers the heat of each of the phosphor layer 220 and the reflective layer 230 to the heat radiator 210. According to the structure illustrated in FIG. 7A, since the heat of the reflective layer 230 can be emitted to the side surface of the hole, the heat radiation performance of the phosphor module may be improved.

In some examples, the structure illustrated in FIG. 7A may be fabricated by forming a hole in the heat radiator 210, and then coating an adhesive on the bottom surface of the hole, and then arranging the phosphor layer 220 and the reflective layer 230 on the coated adhesive body. Here, when adjusting an amount of the adhesive coated on the bottom surface of the hole, the structure of the phosphor module may have a structure as illustrated in FIG. 7B.

Specifically, the adhesive layer 240 may have a first region 241 formed between the bottom surface and the phosphor layer 220, and a second region 242 extended from the first region 241 along one side surface of the reflective layer 230 to bond one side surface of the reflective layer 230 to a side surface provided on the hole.

In other words, in case where the phosphor layer 220 and the reflective layer 230 are disposed on the adhesive coated on the bottom surface of the hole, when a predetermined amount or more of the adhesive is coated, the adhesive is infiltrated into a space between a side surface of the reflective layer 230 and a side surface of the hole. Due to this, it may increase a contact area between the adhesive layer 240 and the reflective layer 230 and between the adhesive layer 240 and the heat radiator 210, thereby increasing a durability of the phosphor module. Also, since the second region 242 can quickly discharge the heat of the reflective layer 230 to a side surface of the reflective layer 230, the heat dissipation performance of the phosphor module may be improved.

As described above, when a hole is formed in the heat radiator 210 and the phosphor layer 220 and the reflective layer 230 are disposed in the hole, the durability and heat radiation performance of the phosphor module may be improved.

In some examples, a concavo-convex structure may be formed on the bottom surface of the hole. A width of the phosphor layer disposed inside the hole is several tens of micrometers. Due to this, a width of the hole is also formed to be several tens of micrometers. Accordingly, a horizontal or vertical length of the bottom surface of the hole is formed to be several tens of micrometers. In examples where the bottom surface of the hole is very narrow, it may be very difficult to form the bottom surface of the hole in a flat manner. In this case, a concavo-convex structure may be formed on the bottom surface of the hole.

Figure 8:
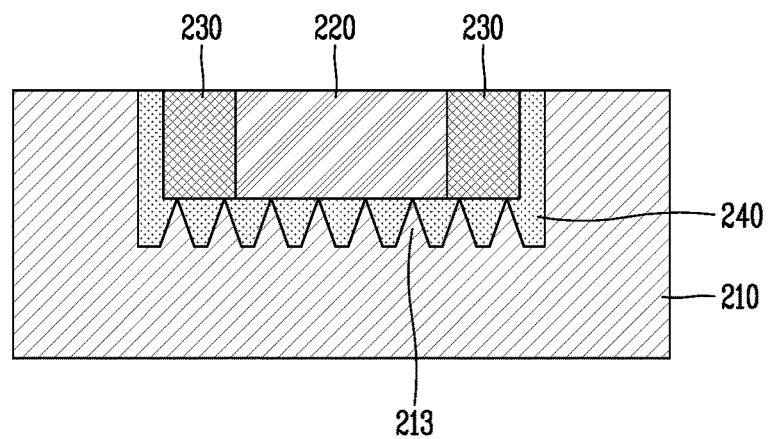
FIG. 8 is a cross-sectional view illustrating an example phosphor module having an example concavo-convex structure on a bottom surface of a hole.

FIG. 8 is a cross-sectional view illustrating a phosphor module having a concavo-convex structure on a bottom surface.

Referring to FIG. 8, a concave-convex structure 213 may be formed on the bottom surface of the hole. A reflectance at the bottom surface of the hole may be reduced due to the concave-convex structure 213. Therefore, the reflection of light directed toward a lower side of the phosphor module may occur from the adhesive layer 240.

The adhesive layer 240 may be made of a white material having a high reflectivity so that the reflection of light directed toward a lower side of the phosphor module may occur at the adhesive layer 240. In some cases, the adhesive layer 240 may be formed to be larger than a thickness of the concave-convex structure 213 so that the adhesive layer 240 can fill a space between the concave-convex structures 213.

In some examples, the present disclosure may include various modified implementations to prevent a reflectance at the bottom surface of the hole due to the concave-convex structure 213 from being decreased.

Figure 9A:
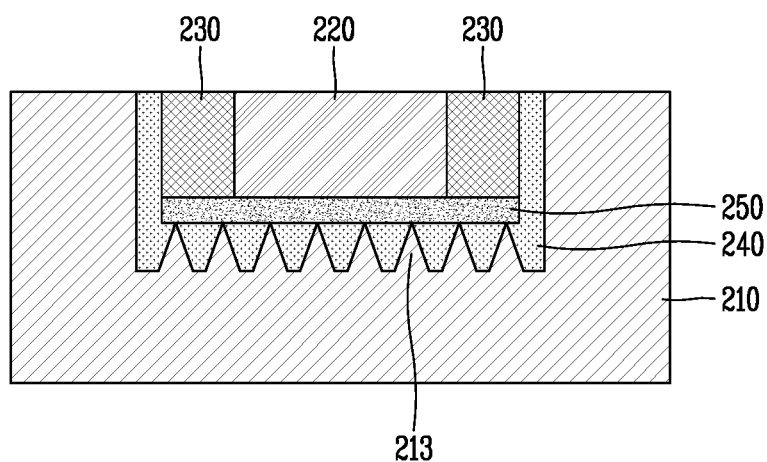
FIGS. 9A and 9B are cross-sectional views illustrating an example phosphor module having an example reflective layer on a bottom surface of a hole.
Figure 9B:
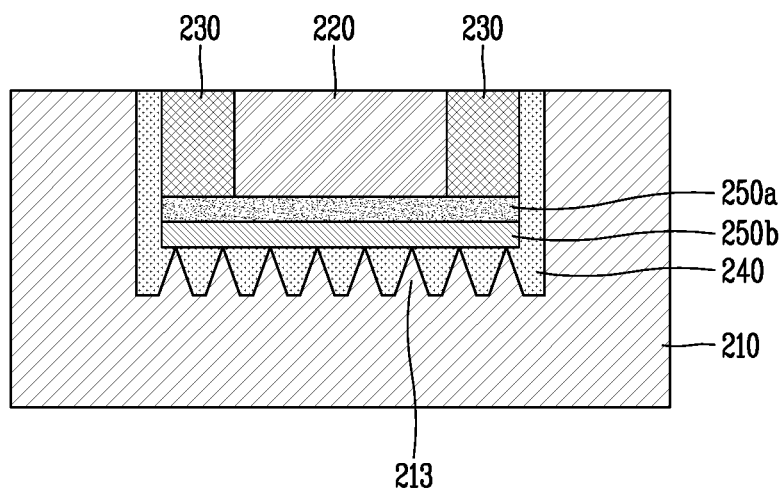

FIGS. 9A and 9B are cross-sectional views illustrating a phosphor module having a reflective layer on a hole bottom surface.

Referring to FIG. 9A, in order to increase the reflectance at the bottom surface of the hole, the present disclosure may further include a reflective film 250 disposed between the adhesive layer and the phosphor layer and formed to reflect light.

The reflective film may be made of a white material having a high reflectivity. Here, since light emitted from the phosphor layer and directed toward a lower side of the phosphor module is reflected by the reflective film 250, the adhesive layer 240 need not be formed of a material having a high reflectance.

According to the structure of FIG. 9A, light emitted from the phosphor layer and directed toward a side surface of the phosphor layer is reflected by the reflective layer 230, and light emitted from the phosphor layer and directed toward a lower surface of the phosphor layer is reflected by the reflective film 250, and thus an amount of light of the phosphor module may be increased. Through this, the present disclosure prevents an amount of light of the phosphor module from being decreased even when an area of the phosphor layer is reduced.

In some examples, the reflective film 250 may not be fabricated together with the phosphor layer 220 and the reflective layer 230 but may be additionally coated on the phosphor layer 220. In this case, the reflective film 250 may be formed of a material different from that of the reflective layer 230.

In some examples, the reflective film 250 may be made of a material having no adhesive force. In this case, the reflective film 250 may not be bonded to the phosphor layer 220. In case where the reflective film 250 and the phosphor layer 220 are not bonded to each other, the phosphor layer 220 is fixed to the heat radiator 210 only by an adhesive layer formed on a side surface of the reflective layer 230. Therefore, a durability of the phosphor module may be reduced.

In some examples, the reflective film may include a first layer 250b bonded to the adhesive layer 240 and made of a metal or an alloy, and a second layer 250a formed on the first layer 250b to bond the first layer 250b to the phosphor layer 220.

In some examples, since the first layer 250b is made of a metal having a high reflectance, the first layer 250b may perform a substantial reflection function and performs a heat dissipation function. In some examples, the second layer 250a bonds the first layer 250b and the phosphor layer 220 to improve the durability of the phosphor module.

Since light output from the phosphor layer 220 and directed toward a lower side of the phosphor module may be reflected by the first layer 250b, the second layer 250a is formed of a light-transmitting material.

According to the structure of FIG. 9B, light emitted from the phosphor layer and directed toward a side surface of the phosphor layer is reflected by the reflective layer 230, and light emitted from the phosphor layer and directed toward a lower surface of the phosphor layer is reflected by the first layer 240b included in the reflective film, and thus an amount of light of the phosphor module may be increased. Through this, the present disclosure prevents an amount of light of the phosphor module from being decreased even when an area of the phosphor layer is reduced.

In some examples, the present disclosure provides a structure for widely spreading laser light reflected from the phosphor module to minimize a yellow ring.

Figure 10:
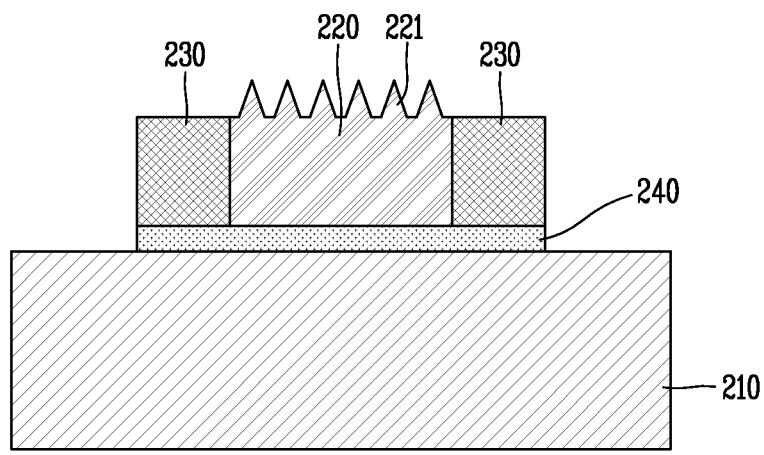
FIG. 10 is a cross-sectional view illustrating an example phosphor module including an example phosphor layer having an example concavo-convex structure.

FIG. 10 is a cross-sectional view illustrating a phosphor module including a phosphor layer having a concavo-convex structure.

Part of blue laser light incident on the phosphor module is reflected by the phosphor layer and directed to an upper side of the phosphor module. Blue light directed toward an upper side of the phosphor module is combined with yellow light output from the phosphor layer. At this time, a yellow ring is generated because the yellow light output from the phosphor layer spreads more widely than the blue light reflected from the phosphor layer.

The present disclosure provides a structure in which blue light reflected by a phosphor layer widely spreads to be combined with yellow light. Specifically, a concave-convex structure 221 may be formed on a surface of the phosphor layer 220.

The concave-convex structure 221 irregularly diffuses part of blue laser light incident on the phosphor layer 220. Through this, blue light reflected by the phosphor layer 220 may be spread more widely, and an amount of blue light that can be combined with yellow light increases, thereby reducing an area of the yellow ring.

Hereinafter, an effect of increasing an amount of light of the phosphor module will be described.

In this specification, after the reflective layer is formed of $TiO_2$ silicone resin at a side surface of the phosphor layer, it is compared with a phosphor module on which the reflective layer is not formed in terms of difference in the amount of light. For a comparison between the phosphor modules, the brightness of light output from the phosphor modules was measured after irradiating blue laser light of the same intensity. The measurement results are shown in Table 1 below.

TABLE 1

| | Phosphor thickness | | | |
|---|---|---|---|---|
| | 0.1 mm | | 0.2 mm | |
| Presence of reflective layer | X | ○ | X | ○ |
| Brightness of phosphor surface (lm) | 536 | 587 (increase by 10%) | 515 | 577 (increase by 12%) |

Referring to Table 1, it may be seen that a reflective layer in the phosphor module increases the brightness of the phosphor module.

It should be understood by those skilled in the art that the present disclosure can be embodied in other specific forms without departing from the concept and essential characteristics thereof.

Furthermore, the detailed description thereof should not be construed as restrictive in all aspects but considered as illustrative. The scope of the disclosure should be determined by reasonable interpretation of the appended claims and all changes that come within the equivalent scope of the disclosure are included in the scope of the disclosure.

What is claimed is:

1. A phosphor module for a laser light source, the phosphor module comprising:
   a heat radiator;
   a phosphor layer disposed at the heat radiator and configured to absorb and emit light, a wavelength of the emitted light being different from a wavelength of the absorbed light;
   a reflective layer that covers a side surface of the phosphor layer and is configured to reflect light; and
   an adhesive layer disposed between the phosphor layer and the heat radiator and between the reflective layer and the heat radiator, the adhesive layer being configured to couple each of the phosphor layer and the reflective layer to the heat radiator,
   wherein a thermal conductivity of the adhesive layer is greater than a thermal conductivity of each of the phosphor layer and the reflective layer,
   wherein the heat radiator defines a recess having a plurality of side surfaces and a bottom surface,
   wherein the phosphor layer and the reflective layer are disposed on the bottom surface of the recess, and
   wherein a thickness of the phosphor layer and a thickness of the reflective layer are, respectively, less than or equal to a depth of the recess.

2. The phosphor module of claim 1, wherein the reflective layer comprises:
   a first reflective layer having a first side that contacts the side surface of the phosphor layer; and
   a second reflective layer that contacts a second side of the first reflective layer that does not contact the side surface of the phosphor layer.

3. The phosphor module of claim 2, wherein a reflectance of the first reflective layer is greater than a reflectance of the second reflective layer.

4. The phosphor module of claim 2, wherein a thermal conductivity of the second reflective layer is greater than a thermal conductivity of the first reflective layer.

5. The phosphor module of claim 1, wherein the reflective layer comprises a mixture of titanium oxide and at least one of alumina ($Al_2O_3$), spinel ($MgAl_2O_4$), or aluminum oxynitride (AlON).

6. The phosphor module of claim 1, wherein the adhesive layer comprises:
   a first region disposed between the bottom surface of the recess and the phosphor layer; and
   a second region that extends from the first region along a side surface of the reflective layer, the second region of the adhesive layer being configured to couple the side surface of the reflective layer to a side surface of the recess among the plurality of side surfaces.

7. The phosphor module of claim 6, wherein the bottom surface of the recess includes a plurality of protrusions and a plurality of recesses.

8. The phosphor module of claim 7, wherein the plurality of protrusions are interposed between the plurality of recesses, respectively.

9. The phosphor module of claim 1, wherein the adhesive layer comprises a Sn—Ag—Cu-based soldering material, a Sn—Au-based soldering material, a Sn—Bi-based soldering material, or an Ag-containing resin material.

10. The phosphor module of claim 1, wherein the reflective layer comprises a ceramic material and is configured to transmit heat generated from the phosphor layer to the reflective layer.

11. The phosphor module of claim 1, wherein a top surface of the phosphor layer includes a plurality of protrusions and a plurality of recesses.

12. The phosphor module of claim 11, wherein the plurality of protrusions are interposed between the plurality of recesses, respectively.

13. The phosphor module of claim 1, wherein the wavelength of the emitted light from the phosphor layer is longer than the wavelength of the absorbed light.

14. The phosphor module of claim 1, wherein the phosphor layer includes at least one of YAG:Ce, LuAG:Ce, $Sr_2SiO_4$:Eu, or a nitride-based yellow phosphor.

15. A phosphor module for a laser light source, the phosphor module comprising:
   a heat radiator;
   a phosphor layer disposed at the heat radiator and configured to absorb and emit light, a wavelength of the emitted light being different from a wavelength of the absorbed light;
   a reflective layer that covers a side surface of the phosphor layer and is configured to reflect light;
   an adhesive layer disposed between the phosphor layer and the heat radiator and between the reflective layer and the heat radiator, the adhesive layer being configured to couple each of the phosphor layer and the reflective layer to the heat radiator; and
   a reflective film disposed between the adhesive layer and the phosphor layer and configured to reflect light,
   wherein a thermal conductivity of the adhesive layer is greater than a thermal conductivity of each of the phosphor layer and the reflective layer.

16. The phosphor module of claim 15, wherein the reflective layer and the reflective film are made of different materials.

17. The phosphor module of claim 15, wherein the reflection film comprises:
   a first layer that contacts the adhesive layer, the first layer comprising a metal material or an alloy; and
   a second layer disposed on the first layer and configured to couple the first layer of the reflection film to the phosphor layer.

18. The phosphor module of claim 15, wherein the heat radiator defines a recess having a plurality of side surfaces and a bottom surface, and
   wherein the phosphor layer and the reflective layer are disposed on the bottom surface of the recess.

19. The phosphor module of claim 18, wherein the bottom surface of the recess includes a plurality of recesses, and a plurality of protrusions interposed between the plurality of recesses, respectively.

20. A phosphor module for a laser light source, the phosphor module comprising:
   a heat radiator;
   a phosphor layer disposed at the heat radiator and configured to absorb and emit light, a wavelength of the emitted light being different from a wavelength of the absorbed light;
   a reflective layer that covers a side surface of the phosphor layer and is configured to reflect light; and
   an adhesive layer disposed between the phosphor layer and the heat radiator and between the reflective layer and the heat radiator, the adhesive layer being configured to couple each of the phosphor layer and the reflective layer to the heat radiator,
   wherein a thermal conductivity of the adhesive layer is greater than a thermal conductivity of each of the phosphor layer and the reflective layer,
   wherein the heat radiator defines a recess configured to receive the phosphor layer and the reflective layer within the recess, and
   wherein a top surface of the phosphor layer and a top surface of the reflective layer are coplanar with a top surface of the heat radiator.

* * * * *